(12) United States Patent
Yang et al.

(10) Patent No.: US 8,872,153 B2
(45) Date of Patent: Oct. 28, 2014

(54) DEVICE STRUCTURE FOR LONG ENDURANCE MEMRISTORS

(75) Inventors: Jianhua Yang, Palo Alto, CA (US); Minxian Max Zhang, Mountain View, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 13/822,227

(22) PCT Filed: Sep. 27, 2010

(86) PCT No.: PCT/US2010/050381
§ 371 (c)(1),
(2), (4) Date: Mar. 11, 2013

(87) PCT Pub. No.: WO2012/044276
PCT Pub. Date: Apr. 5, 2012

(65) Prior Publication Data
US 2013/0175497 A1    Jul. 11, 2013

(51) Int. Cl.
*H01L 45/00* (2006.01)
*G11C 13/00* (2006.01)
*H01L 27/24* (2006.01)

(52) U.S. Cl.
CPC ............. *H01L 45/14* (2013.01); *H01L 45/149* (2013.01); *H01L 45/148* (2013.01); *H01L 45/1608* (2013.01); *H01L 45/1233* (2013.01); *H01L 45/146* (2013.01); *H01L 45/08* (2013.01); *G11C 2213/32* (2013.01); *G11C 13/0007* (2013.01); *G11C 2213/52* (2013.01); *H01L 45/147* (2013.01); *H01L 27/2463* (2013.01); *G11C 2213/15* (2013.01); *H01L 45/145* (2013.01)
USPC ........................................................... 257/4

(58) Field of Classification Search
CPC .............. H01L 45/146; H01L 45/1233; H01L 27/2463
USPC .................................................... 257/4, 5, 4.5
See application file for complete search history.

(56) References Cited

U.S. PATENT DOCUMENTS 7,417,271 B2    8/2008    Genrikh et al.
2005/0110117 A1    5/2005    Hsu
(Continued)

FOREIGN PATENT DOCUMENTS

EP    2141753    1/2010
JP    2009-021431 A    1/2009
(Continued)

OTHER PUBLICATIONS

Miller et al., "Memristive Behavior in Thin Anodic Titania", IEEE Electron Device Letters, vol. 31, No. 7, Jul. 2010, pp. 737-739.*
Translation of WO-2010064446.*
Extended Search Report. Jun. 28, 2013. European Patent Office, Munich, Germany. European Patent Application No. 10857972.3.
Busania and Devine, "Nonvolatile memory and antifuse behavior in Pt/a-TiO2 /Ag structures", J. Vac. Sci. Technol. B, Sep./Oct. 2008, vol. 26 No. 5.
(Continued)

*Primary Examiner* — Thomas L Dickey (57) ABSTRACT

A memristor includes a first electrode formed of a first metal, a second electrode formed of a second material, wherein the second material comprises a different material from the first metal, and a switching layer positioned between the first electrode and the second electrode. The switching layer is formed of a composition of a first material comprising the first metal and a second nonmetal material, in which the switching layer is in direct contact with the first electrode and in which at least one conduction channel is configured to be formed in the switching layer from an interaction between the first metal and the second nonmetal material.

13 Claims, 7 Drawing Sheets

(56) References Cited

U.S. PATENT DOCUMENTS

| | | |
|---|---|---|
| 2007/0015328 A1 | 1/2007 | Hsu et al. |
| 2007/0015329 A1 | 1/2007 | Li et al. |
| 2008/0090337 A1 | 4/2008 | Williams |
| 2008/0206931 A1 | 8/2008 | Breuil et al. |
| 2008/0220601 A1 | 9/2008 | Kumar et al. |
| 2010/0172170 A1 | 7/2010 | Tamai et al. |

FOREIGN PATENT DOCUMENTS

| | | |
|---|---|---|
| JP | 2010-015662 A | 1/2010 |
| JP | 2010-040665 A | 2/2010 |
| KR | 10-2009-0091692 A | 8/2009 |
| KR | 10-2010-0004363 A | 1/2010 |
| WO | WO-2008075413 A1 | 6/2008 |
| WO | WO-2009015297 A1 | 1/2009 |
| WO | WO 2010064446 A1 * | 6/2010 |
| WO | WO-2010080079 | 7/2010 |
| WO | WO-2010082922 | 7/2010 |
| WO | WO-2010082929 | 7/2010 |
| WO | WO-2010085227 | 7/2010 |
| WO | WO-2010085282 | 7/2010 |

OTHER PUBLICATIONS

Deok-Hwang et al., "Atomic Structure of Conducting Nanofilaments in Tio2 Resistive Switching Memory", Nature Nanotechnology, 2010; 148-153, vol. 5.

Eshraghian, Kamran et al., "Memristor MOS Content Addressable Memory (MCAM): Hybrid Architecture for Future High Performance Search Engines", IEEE Transactions on Very Large Scale Integration (VLSI) Systems.

Hyejung et al., "An Electrically Modifiable Synapse Array of Resistive Switching Memory", Nanotechnology, vol. 20, No. 34.

International Search Report (May 30, 2011), Application No. PCT/US2010/050381, Filed Sep. 27, 2010.

Miller, Kyle, "Fabrication and Modeling of Thin-Film Anodic Titania Memristors", <http://archives.ece.iastate.edu/archive/00000560/01/Thesis_final_Fig.pdf>.

Sung Hyun Jo and Wei Lu, "CMOS Compatible Nanoscale Nonvolatile Resistance Switching Memory", Nano Lett., 2008, 8 (2), pp. 392-397.

Tan, Zhonkui, "Experimental Study of Electron Transport Through Nanometer-Scale Metal-Oxide Junctions", <http://pavel.physics.sunysb.edu/~likharev/nano/ZTanPhD10.pdf>.

* cited by examiner

DEVICE STRUCTURE FOR LONG ENDURANCE MEMRISTORS

BACKGROUND

Memristor switch devices, which are often formed of nanoscale metal/titanium oxide/metal layers, employ an "electroforming" process to enable resistive switching. The "electroforming" process involves a one-time application of a relatively high voltage or current that produces a significant permanent change of electronic conductivity through the titanium oxide layer. The electrical switching arises from the coupled motion of electrons and ions within the oxide material. During the electroforming process, oxygen vacancies are created and drift towards the cathode, forming localized conducting channels of sub-oxides in the oxide. Simultaneously, $O^{2-}$ ions drift towards the anode where they evolve $O_2$ gas, causing physical deformation of the junction. The gas eruption often results in physical deformation of the oxide, such as, bubbles, near the locations where the conducting channels form. In addition, the conducting channels formed through the electroforming process often have a wide variance of properties depending upon how the electroforming process occurred. This variance of properties has relatively limited the adoption of metal oxide switches in computing devices. In addition, these devices usually suffer from a poor endurance, which is the number of times that the device can reversibly switch ON and OFF.

BRIEF DESCRIPTION OF THE DRAWINGS

Embodiments are illustrated by way of example and not limited in the following figure(s), in which like numerals indicate like elements, in which.

DETAILED DESCRIPTION

For simplicity and illustrative purposes, the principles of the embodiments are described by referring mainly to examples thereof. In the following description, numerous specific details are set forth in order to provide a thorough understanding of the embodiments. It will be apparent however, to one of ordinary skill in the art, that the embodiments may be practiced without limitation to these specific details. In other instances, well known methods and structures are not described in detail so as not to unnecessarily obscure the description of the embodiments.

Disclosed herein is a memristor, which may generally be defined as an electrically actuated apparatus, formed of a pair of spaced apart electrodes with a switching material positioned between the electrodes. The first electrode and the switching layer are formed of the same type of metal. More particularly, for instance, the first electrode is formed of tantalum and the switching layer is formed of a tantalum oxide. As other examples, the first electrode is formed of other types of metals and the switching layer includes oxides formed with those other types of metals. In any regard, the inventors have found that the combination of the materials implemented in the memristor disclosed herein unexpectedly produce high endurance switching, for instance, greater than 12 billion on-off cycles.

In addition, at least one conductance channel is designed to be formed in the switching layer without requiring that an electroforming process be performed on the memristor. Instead, the voltage level used to form the at least one conductance channel is similar to the voltage levels used to turn the memristor on and off. Moreover, the memristor disclosed herein contains a mobile ion/vacancy source, in which, the ions and the vacancies move within an isolated system, is asymmetric, and minimizes gas eruption/bubble formation during switching. As memristors continue to become smaller, for example to less than 30 nm, the size of the channels could be comparable to the size of the memristors themselves.

The memristor discussed herein may be implemented in a cross-bar array formed of a plurality of the memristors. In one respect, conductance channels in the plurality of memristors may be formed concurrently with each other through the fabrication process discussed herein.

The term "singly configurable" means that a switch is able to change its state only once via an irreversible process such as an electrochemical oxidation or reduction reaction; such a switch may be the basis of a programmable read only memory (PROM), for example.

The term "reconfigurable" means that a switch can change its state multiple times via a reversible process such as an electrochemical oxidation or reduction; in other words, the switch may be opened and closed multiple times such as the memory bits in a random access memory (RAM).

The term "configurable" means either "singly configurable" or "reconfigurable".

Micron-scale dimensions refer to dimensions that range from 1 micrometer to a few micrometers in size.

Sub-micron scale dimensions refer to dimensions that range from 0.1 nanometers to 1 micrometers.

Micron-scale and submicron-scale wires refer to rod or ribbon-shaped conductors or semiconductors with widths or diameters having the dimensions of 0.005 to 10 micrometers, heights that can range from a few nanometers to a micrometer, and lengths of several micrometers and longer.

A memristor is a two-terminal device in which the magnetic flux between the terminals is a function of the amount of electric charge that has passed through the device.

A crossbar is an array of memristors that can connect each wire in one set of parallel wires to every member of a second set of parallel wires that intersects the first set (usually the two sets of wires are perpendicular to each other, but this is not a necessary condition).

Figure 1:
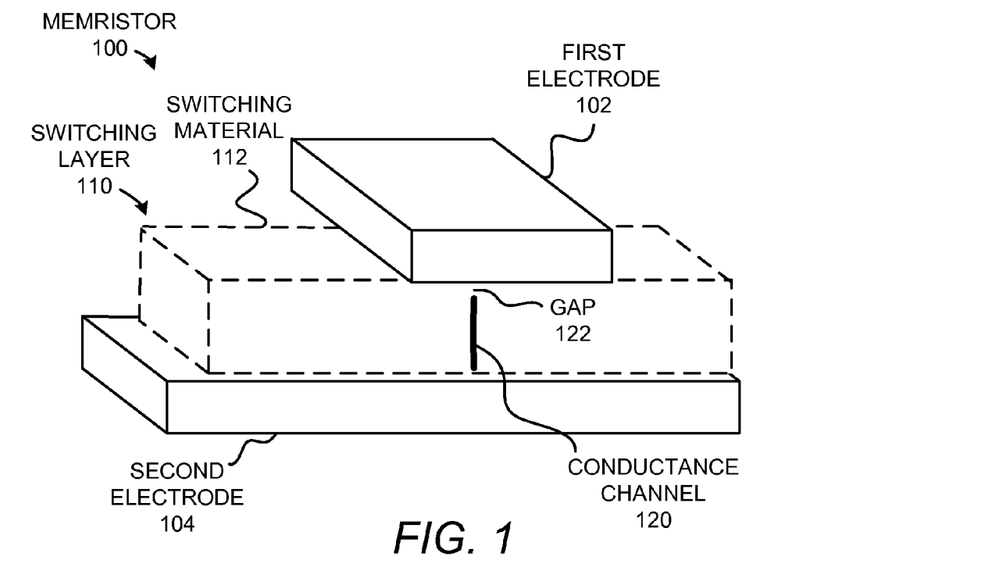
FIG. 1 illustrates a perspective view of a memristor, according to an embodiment of the invention.

With reference first to FIG. 1, there is shown a perspective view of a memristor 100, according to an embodiment. It should be understood that the memristor 100 depicted in FIG. 1 may include additional components and that some of the components described herein may be removed and/or modified without departing from a scope of the memristor 100. It should also be understood that the components depicted in FIG. 1 are not drawn to scale and thus, the components may have different relative sizes with respect to each other than as shown therein.

Generally speaking, the memristor 100 depicted in FIG. 1 may be built at the micro- or nano-scale and used as a component in a wide variety of electronic circuits. For instance, the memristor 100 may be used as the basis for memories, switches, logic circuits, and analog circuits. When used as a basis for memories, the memristor 100 may be used to store a bit of information, 1 or 0. When used as a switch, the memristor 100 may either be a closed or open switch in a cross-point memory. When used as a logic circuit, the memristors 100 may be employed as bits in a logic circuit that resembles a Field Programmable Gate Array, or as the basis for a wired-logic Programmable Logic Array. The memristor 100 disclosed herein is also configured to find uses in a wide variety of other applications.

As depicted in FIG. 1, the memristor 100 includes a first electrode 102 positioned above a second electrode 104. In addition, the first electrode 102 is in a crossed arrangement with respect to the second electrode 104, such that the first electrode 102 is arranged substantially perpendicularly to the second electrode 104. One or both of the first electrode 102 and the second electrode 104 may be formed of metal or semiconductor materials. According to an embodiment, the first electrode 102 is formed of a first metal and the second electrode 104 is formed of a second metal, such as, a noble metal, in which, the first metal and the second metal differ from each other. By way of example, the first electrode 102 is formed of a metal, such as, tantalum (Ta), hafnium (Hf), yttrium (Y), cobalt (Co), erbium (Er), scandium (Sc), etc. In addition, the second electrode 104 is formed of a metal, such as, platinum (Pt), tungsten (W), copper (Cu), aluminum (Al), gold (Au), titanium (Ti), silver (Ag), titanium nitride (TiN), tungsten nitride (WN) or the like. As another particular example, the second electrode 104 is formed of doped silicon. In any regard, the materials for the first electrode 102, the second electrode 104, and the switching layer 110 may be selected such that the contact between the first electrode 102 and the switching layer 110 is ohmic and that the contact between the second electrode 104 and the switching layer 110 is non-ohmic. The relative position of the first electrode 102 may be reversed with respect to the second electrode 104 from the configuration shown in FIG. 1.

The memristor 100 also includes a switching layer 110 disposed between and in direct contact with the first electrode 102 and the second electrode 104. The switching layer 110 has been shown with dashed lines to indicate that the switching layer 110 may be relatively larger than the first electrode 102 and the second electrode 104 and thus only a portion of the switching layer 110 has been depicted in FIG. 1. In other embodiments, the switching layer 110 may be relatively smaller than or have approximately the same width as the first electrode 102 and the second electrode 104. The switching layer 110 comprises a composition of switching materials 112 that promote the formation of a conductance channel 120 in the switching layer 110.

According to an embodiment, the switching materials 112 comprise a composition of the same metal used to form the first electrode 102 and a nonmetal material. The nonmetal material may comprise, for instance, oxygen (O), nitrogen (N), carbon (C), sulfur (S), phosphorus (P), chlorine (Cl), and the like. According to a particular example, the switching materials 112 comprise a composition of tantalum and oxygen. According to other examples, the switching materials 112 comprise other compositions, such as, yttrium oxide, cobalt oxide, erbium oxide, scandium oxide, etc. According to further examples, the switching materials 112 comprise titanium dioxide ($TiO_2$) or other oxide species, such as nickel oxide, zinc oxide, hafnium oxide, zirconium oxide, etc. The switching material 112 may also be formed of ternary or quaternary oxides, or other complex oxides, such as, STO, PCMO, etc. The switching material 112 may further be formed of nitrides and/or sulfides.

The composition of materials forming the switching material 112 may comprise any suitable materials within which a conductance channel 120 is likely to be formed during a forming operation. More particularly, for instance, the composition of switching materials may be selected to react with each other through oxygen transport during the forming operation. The composition of the materials forming the switching material 112 may thus be selected based upon how the materials interact with each other. This selection may be based upon information contained in phase diagrams that depict the interactions of the materials with respect to each other as discussed in greater detail hereinbelow.

As also shown in FIG. 1, the conductance channel 120 is formed in the switching layer 110 at a junction between the first electrode 102 and the second electrode 104. Although a single conductance channel 120 has been depicted in FIG. 1, a plurality of conductance channels 120 may form in the switching layer 110 at the junction. The conductance channel 120 is configured to be formed through a localized atomic modification in the switching layer 112 caused by application of a forming voltage through the switching layer 110. By way of particular example in which the switching material 112 comprises $TaO_2$, during the forming process, the $TaO_2$ layer will decompose into $Ta_2O_5$ and $Ta(O)$. The $Ta(O)$ phase is a Ta and oxygen solid solution, which serves as the conductance channels 120. The $Ta_2O_5$ phase is an insulating phase, which serves as a matrix to host the conductance channels 120. The $Ta(O)$ conductance channels 120 may grow or retreat in the $Ta_2O_5$ matrix under application of an electric field depending on the polarity of the electric field, leading to the ON and OFF switching. One or more conductance channels 120 are configured to form in the areas containing the reduced $TaO_{2-x}$ and these conductance channel(s) 120 are responsible for the subsequent switching in the memristor 100.

During the switching operation, the oxygen atoms are configured to move in an electric field conducted through the conductance channel(s) 120 to open or close a gap 122 inside the conductance channel(s) 120, which may be read to determine whether the memristor 100 is in an on or off state.

The conductance channel(s) 120 are referred to herein as the active region of the memristor 100. In one regard, the conductivity of the conductance channel(s) 120 may be modulated by applying different biases across the first electrode 102 and the second electrode 104. Thus, the memristor 100 may be reconfigurable based upon the bias applied across the first electrode 102 and the second electrode 104. In other instances, however, the switching layer 110 is formed to be singly configurable.

Figure 2:
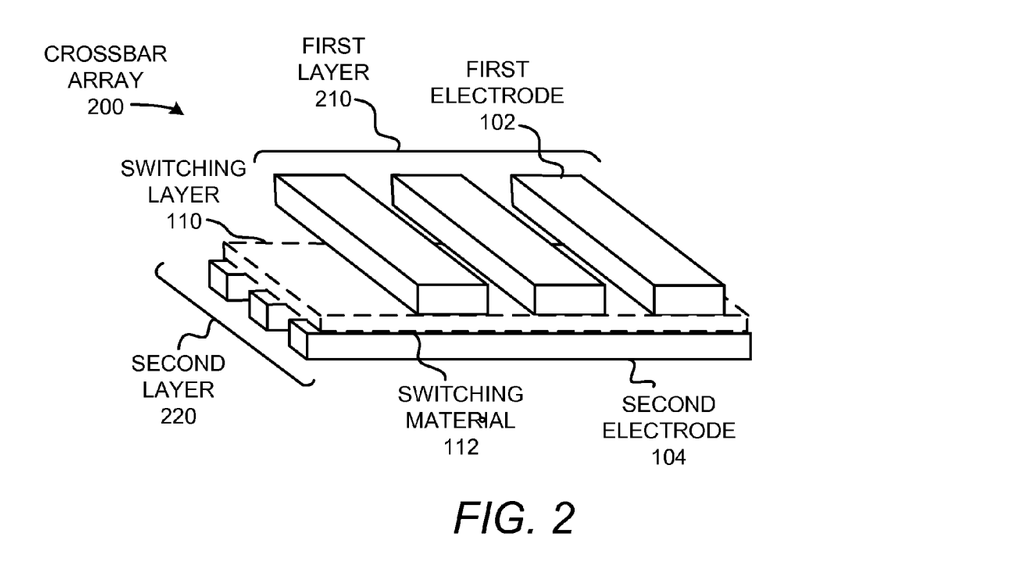
FIG. 2 illustrates a perspective view of a crossbar array employing a plurality of the memristors depicted in FIG. 1, according to an embodiment of the invention.

With reference now to FIG. 2, there is shown a perspective view of a crossbar array 200 employing a plurality of the memristors 100 shown in FIG. 1, according to an embodiment. It should be understood that the crossbar array 200 depicted in FIG. 2 may include additional components and that some of the components described herein may be removed and/or modified without departing from a scope of the crossbar array 200.

As shown in FIG. 2, a first layer 210 of approximately parallel first electrodes 102 overlays a second layer 220 of approximately parallel second electrodes 104. The second electrodes 104 of the second layer 220 are roughly perpendicular, in orientation, to the first electrodes 102 of the first layer 210, although the orientation angle between the layers may vary. The two layers 210 and 220 form a lattice, or crossbar, with each second electrode 104 of the second layer 220 overlying all of the first electrodes 102 of the first layer 210 and coming into close contact with each first electrode 102 of the first layer 210 at respective junctions, which represent the closest contact between two of the first and second electrodes 102 and 104. The crossbar array 200 may be fabricated from micron-, submicron or nanoscale-electrodes 102, 104, depending on the application.

As also shown in FIG. 2, the switching layer 110 extends between the first layer 210 and the second layer 220. As discussed in greater detail herein below, respective conductance channels 120 (FIGS. 1 and 3) are formed in multiple ones of the memristors 100 concurrently during the thermal forming process.

Although the first electrode 102 and the second electrode 104 have been depicted as having rectangular cross-sections in FIGS. 1 and 2, it should be understood that the first electrode 102 and/or the second electrode 104 may have other cross-sectional shapes, such as, circular, oval, hexagonal, triangular, trapezoidal, etc.

Figure 3:
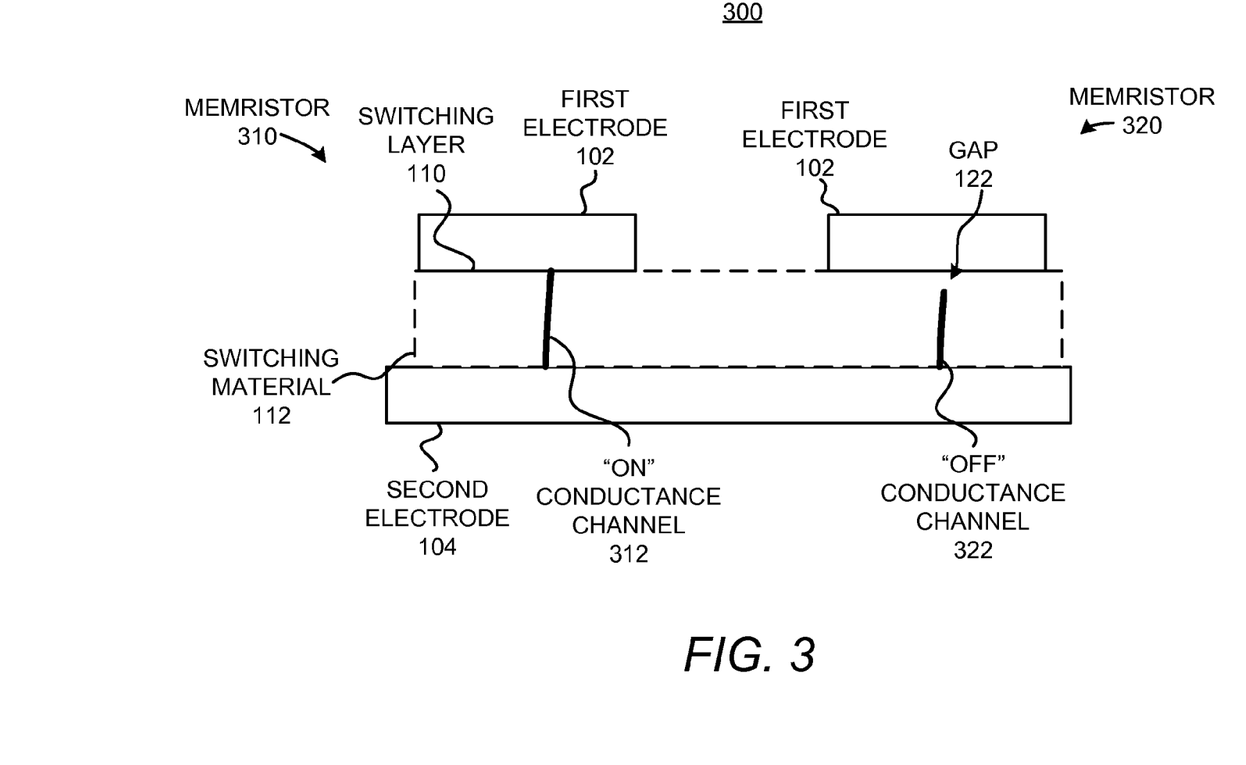
FIG. 3 illustrates a cross-sectional side view of a pair of memristors, according to an embodiment of the invention.

Turning now to FIG. 3, there is shown a cross-sectional side view 300 of a pair of memristors 310 and 320, according to an example. As shown therein, a first memristor 310 is depicted as having an "on" conductance channel 312 formed in the junction between a first electrode 102 and the second electrode 104. The conductance channel 312 is construed as being "on" because the conductance channel 312 extends from the first electrode 102 to the second electrode 104 or a very small gap is formed between the tip of the conductance channel 120 and the first electrode 102 and thus, there is a relatively low resistance to electrical energy supplied between the first electrode 102 and the second electrode 104 of the first memristor 310.

As also shown in FIG. 3, a second memristor 320 is depicted as having an "off" conductance channel 322 formed in the junction between a first electrode 102 and the second electrode 104 of the second memristor 320. The conductance channel 322 is construed as being "off" because the conductance channel 322 does not extend from the first electrode 102 to the second electrode 104 or a larger gap is formed between the tip of the conductance channel 120 and the first electrode 102. In this regard, a gap 122 is depicted as existing in the conductance channel 322 and thus, there is a relatively higher resistance to electrical energy supplied between the first electrode 102 and the second electrode 104 of the second memristor 320 than between the first electrode 102 and the second electrode 104 of the first memristor 310.

Figure 4A:
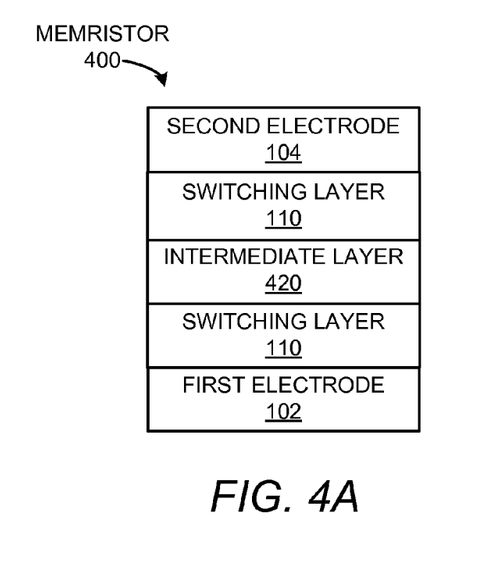
FIGS. 4A and 4B, respectively illustrate alternate configurations of the memristors depicted in FIGS. 1 and 3, according to embodiments of the invention.
Figure 4B:
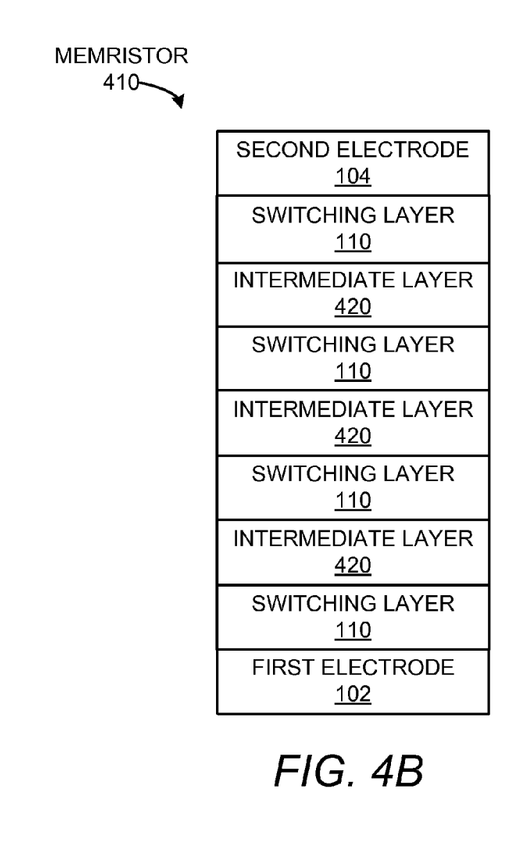

The memristors 100, 300 depicted in FIGS. 1-3 may have alternate configurations from those depicted in FIGS. 1-3. For instance, a functional layer (not shown) may be inserted between the switching layer 110 and the second electrode 104 and thus, the second electrode 104 may not be in direct contact with the switching layer 110 in certain embodiments. As another example, and as shown in FIGS. 4A and 4B, the memristors 100, 300 may include one or more intermediate layers 420 positioned between one or more additional switching layers 110 as compared to the memristors 100, 300 depicted in FIGS. 1-3. Although not explicitly shown, any of the memristors 400 and 410 depicted in FIGS. 4A and 4B may be implemented as the memristors 100 in the crossbar array 200 depicted in FIG. 2.

As shown in FIG. 4A, the memristor 400 is depicted as including a first electrode 102, a pair of switching layers 110, an intermediate layer 420 positioned between the pair of switching layers 110, and a second electrode 104 positioned above one of the switching layers 110. More particularly, the intermediate layer 420 is positioned between the switching layers 110, which are positioned between the first electrode 102 and the second electrode 104. As shown in FIG. 4B, the memristor 410 is depicted as including three intermediate layers 420 and four switching layers 110 positioned between a first electrode 102 and a second electrode 104. Although a particular number of intermediate layers 420 and switching layers 110 have been depicted in FIG. 4B, it should be clearly understood that the memristor 410 may include any reasonably suitable number of intermediate layers 420 and switching layers 110 positioned between the first electrode 102 and the second electrode 104.

Figure 7:
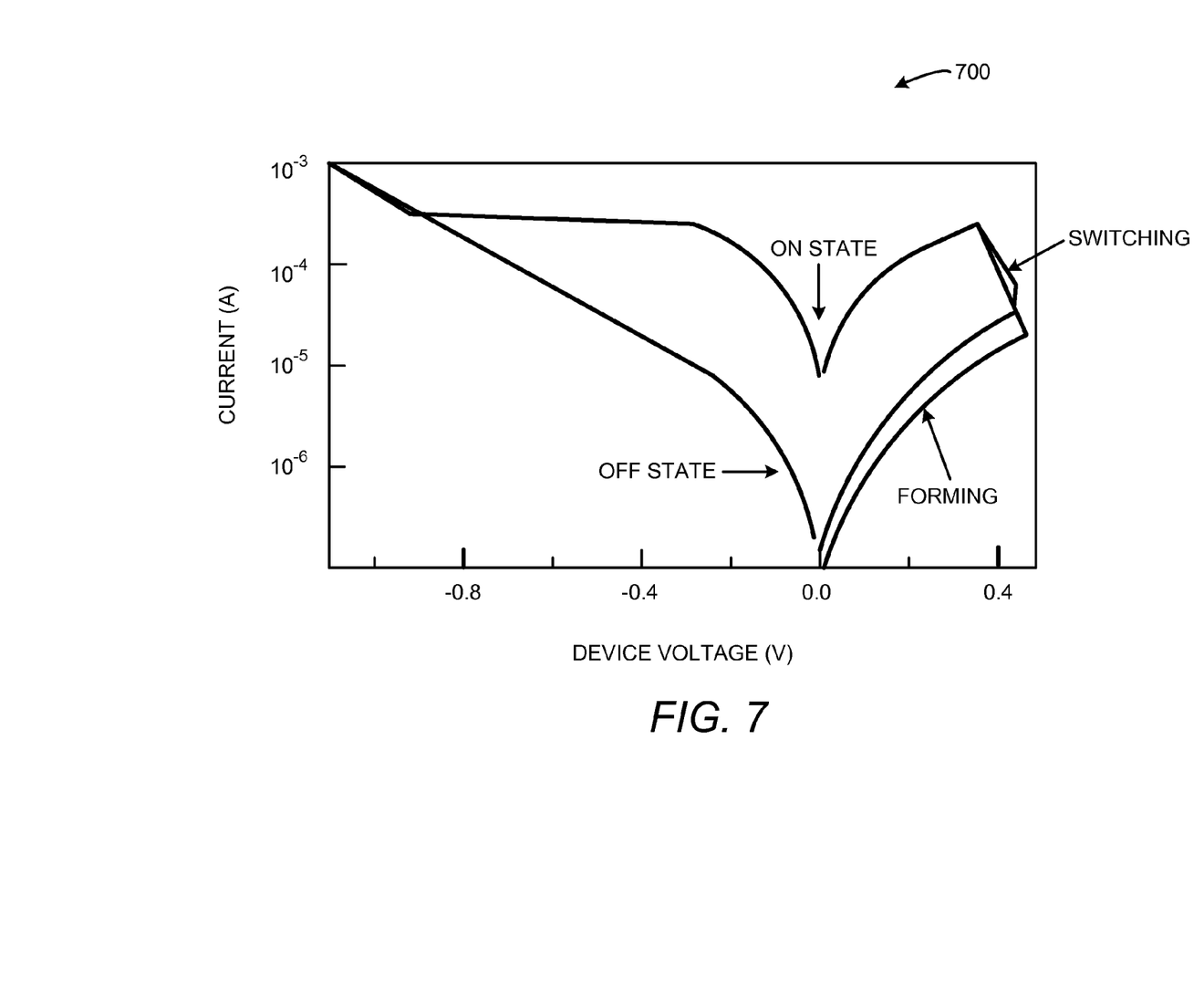
FIG. 7 depicts a graph of the operating characteristics of the memristor disclosed herein, according to an embodiment of the invention.

According to an embodiment, the intermediate layer(s) 420 comprises a metal, such as, any of the metals discussed above with respect to the first electrode 102. In one regard, the intermediate layer(s) 420 generally operate to create nonlinearity in the I-V curves (for instance, as shown in FIG. 7) of a memristor by introducing some metal/oxide contact within the memristor. In instances where the intermediate layer(s) 420 is formed of the same material as the metal element of the switching layers 110, the intermediate layer(s) 420 also serve as a mobile dopant reservoir for the switching layers 110.

Figure 5:
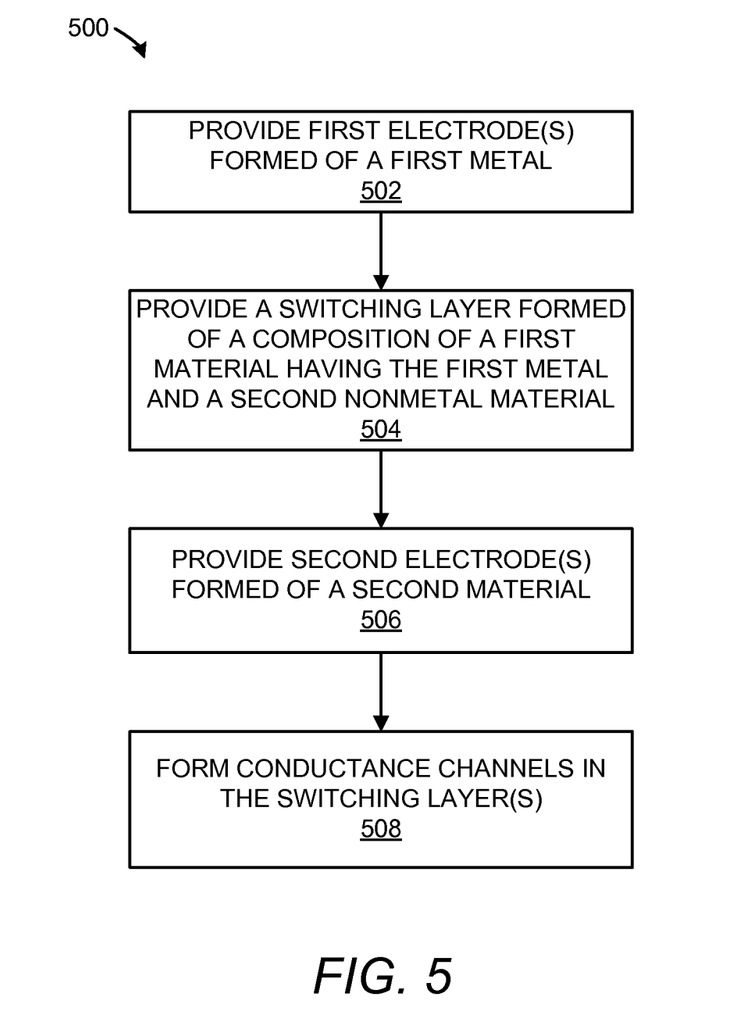
FIG. 5 illustrates a flow diagram of a method for fabricating a memristor, according to an embodiment of the invention.

Turning now to FIG. 5, there is shown a flow diagram of a method 500 for fabricating a memristor 100, 300, according to an embodiment. It should be understood that the method 500 depicted in FIG. 5 may include additional steps and that some of the steps described herein may be removed and/or modified without departing from a scope of the method 500. For instance, although the first electrode 102 is described as being provided before the second electrode 104, it should be understood that the second electrode 104 may be provided before the first electrode 102 without departing from a scope of the method 500.

At step 502, at least one first electrode 102 formed of a first metal is provided. The first electrode(s) 102 may be provided through any suitable formation process, such as, chemical vapor deposition, sputtering, etching, lithography, etc. In addition, when the method 500 is implemented to form a cross-bar array 200, a plurality of first electrodes 102 may be provided as a first layer 210 of first electrodes 102, for instance, as depicted in FIG. 2. As discussed above, the first metal may comprise, for instance, tantalum (Ta), hafnium (Hf), yttrium (Y), cobalt (Co), erbium (Er), scandium (Sc), etc.

At step 504, a switching layer 110 formed of a combination of first material comprising the first metal of the first electrode 102 and a second nonmetal material is provided upon the first electrode(s) 102. According to an example, the materials forming of the switching layer 110 is co-deposited, such as, through sputtering, pulse laser deposition, atomic layer deposition, etc., to form the switching layer 110. According to another example, the first metal material and the second nonmetal material are interspersed into a switching material 112 prior to deposition of the composition of materials on the first electrode(s) 102. According to another example, the switching material 112 containing the first metal material and the second nonmetal material is grown on the electrode(s) 102. In this example, the switching material 112 may be grown through use of, for instance, metal-catalyzed growth from vapor, liquid, or solid-phase precursors, growth from a chemical solution, spin coating or rapid deposition of material vaporized from a solid source. According to a further example, the switching material 112 is formed by phase decomposition from a metastable phase, which decomposes into two phases upon heating by annealing or localized joule heat. One of the two phases is a conducting phase, serving as the conductance channels 120 and the other phase is the insulating phase serving as the matrix that hosts the conductance channels 120. The criteria for selecting the switching materials are (1) the material(s) forming the conductance channels 120 is in thermodynamic equilibrium with the material(s) of the matrix hosting the conductance channels 120; and (2) a first metal that forms the first electrode 102 and the conductance channels 120 with oxygen is required to have a at least a predetermined amount of oxygen solubility at room temperature. In one example, the oxygen solubility is greater than 1% at room temperature.

Figure 6:
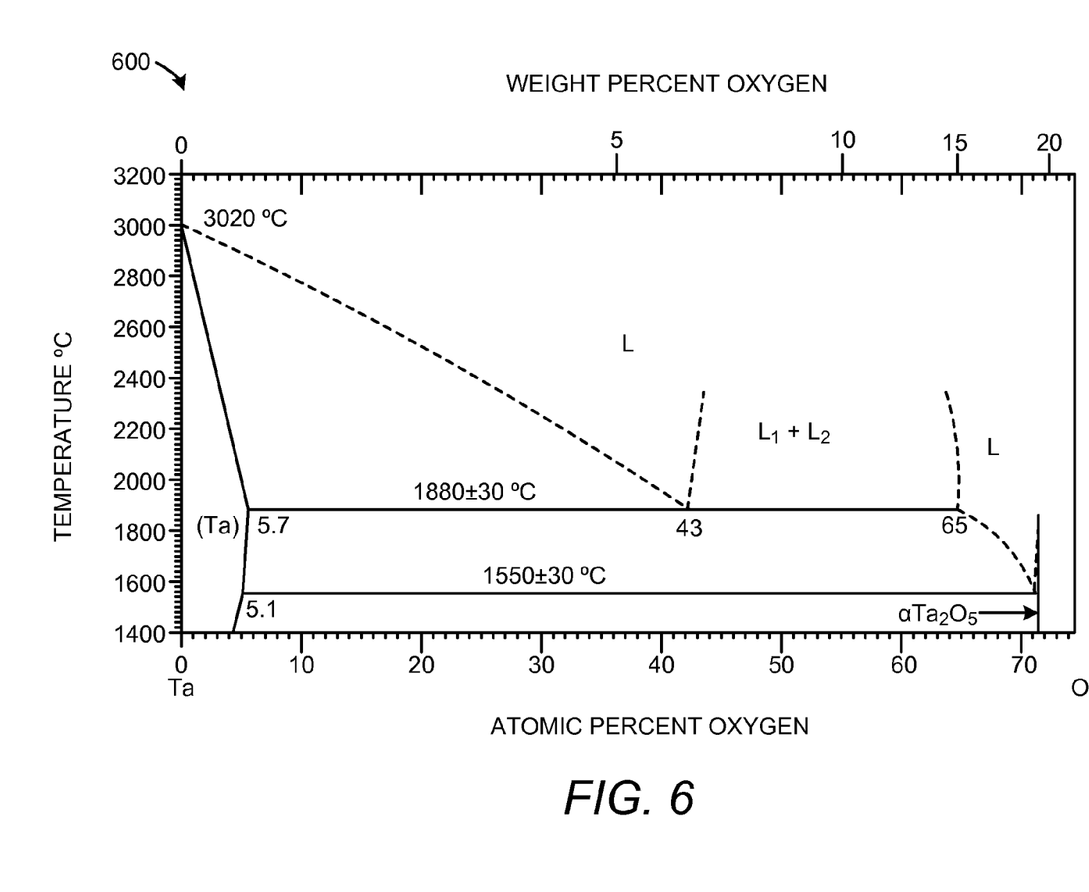
FIG. 6 illustrates a phase diagram of a composition containing tantalum and oxygen that may be implemented in selecting a composition of a switching layer of the memristor disclosed herein, according an embodiment of the invention.

In any regard, the amount of the first metal material and the second nonmetal material contained in the composition forming the switching layer 110 may selected based upon known composition ratios at which the first metal material reacts in a substantially predefined manner with the second nonmetal material. More particularly, for instance, the composition ratios may be selected such that the composition of the two materials has a relatively long term equilibrium state and has two stable phases. According to an example, the percentages of the first metal material and the second nonmetal material may be selected from a phase diagram of the first metal material and the second nonmetal material. An example of a suitable phase diagram 600 is depicted in FIG. 6.

The phase diagram 600 illustrates phases containing tantalum (Ta) and oxygen (O) at different composition and different temperatures. As shown therein, there are two stable phases listed as Ta(O) and ($\alpha Ta_2O_5$). The conduction channels 120 formed of Ta(O) are thus in equilibrium with the matrix $Ta_2O_5$. The average composition of the switching layer before phase decomposition may be selected in the phase diagram to guarantee a large amount of the matrix phase with a small amount of conductive channel phase. In one example, the average composition is 67% oxygen and 33% tantalum.

Following step 504, a top surface of the switching layer 110 may be planarized, for instance, by chemical-mechanical polishing, to create a relative smooth surface.

At step 506, at least one second electrode 104 is formed on the switching layer 110. The one or more second electrodes 104 may be provided through a formation process, such as E-beam evaporation, chemical vapor deposition, sputtering, atomic layer deposition, etching, (imprint) lithography, etc. In addition, and as discussed in greater detail herein above, the second electrode(s) 104 comprise a material that differs from the first metal contained in the first electrode(s) 102 and the switching layer 110.

At step 508, at least one conductance channel 120 is formed in the at least one switching layer 110. According to an example, the at least one conductance channel 120 is formed through the very first switching operation. More particularly, for instance, a relatively low voltage, around a voltage level used during on-off operations of the memristor 100 is used to form the at least one conductance channel 120, is applied on the first electrode(s) 102, the switching layer 110, and the second electrodes (104) to cause one or more conductance channels 120 to form in one or more junctions of the first electrode(s) 102 and second electrode(s) 104. As discussed above, the application of voltage to the switching layer 110 causes a chemical reaction to occur between composition of materials in the switching material 112, which is designed to result in the formation of conductance channel(s) 120 in the switching layer 110.

Although step 508 has been described as being performed after the second electrode(s) 104 have been provided, it should be understood that the annealing operation may be performed prior the second electrode(s) 104 being provided. In addition, although not explicitly shown in FIG. 5, the method 500 may include one or more additional steps for providing one or more intermediate layers 420 and one or more second switching layers 110 in the memristor as discussed above with respect to FIGS. 4A and 4B.

Through implementation of the method 500, conductance channels 120 may be formed in the switching layer 110 between one or more memristors 100 without requiring that an electroforming operation be implemented to form the conductance channels 120. In instances where the method 500 is employed to form the conductance channels 120 in multiple memristors 100, the method 500 may also be implemented to concurrently form the conductance channels 120 in the memristors 100.

Experimental Results

FIG. 7 depicts a graph 700 of the operating characteristics of the a memristor 100 formed according to the embodiments discussed above, provided as current versus applied voltage, for instance, an IV curve. The x-axis, or horizontal axis, depicts the device voltage in volts applied to the memristor 100, for instance, the first and/or second electrodes 102 and 104. The y-axis, or vertical axis, depicts the current in amperes flowing through the switching layer 110. As shown therein, the graph 700 depicts an on-state where the memristor 100 is in a relatively low resistance state and an off-state where the memristor 100 is in a relatively high resistance state. The graph 700 also depicts the voltage and current during a conductance channel 120 forming operation. As noted therein, the voltage required to form the conductance channel 120 is comparable to the voltages for the on-state and the off-state. As such, the memristor disclosed herein is considered to be an electroforming free memristor.

Figure 8:
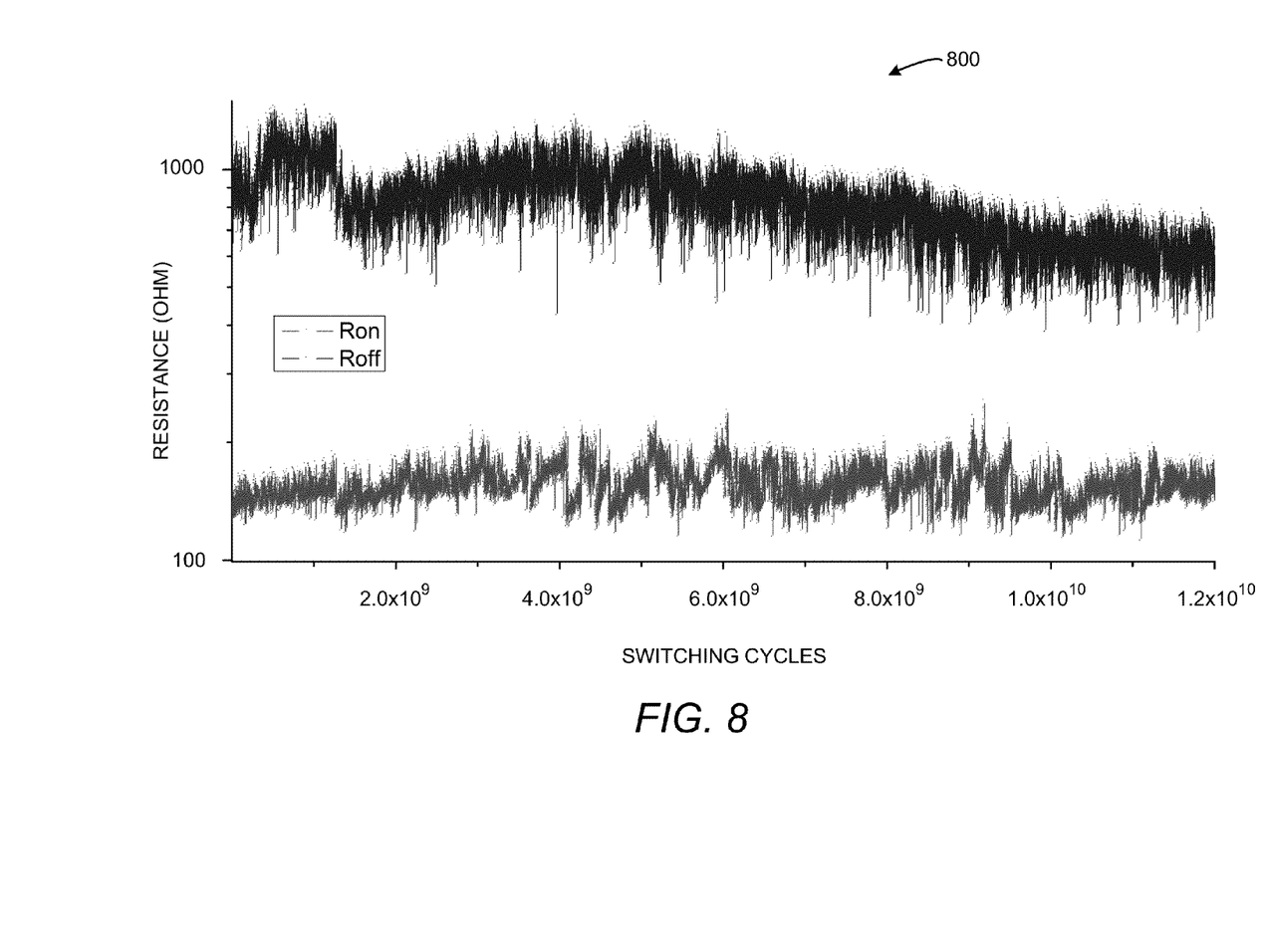
FIG. 8 depicts a graph of the first 12 billion switching cycles resulting from a memristor configured as disclosed herein, according to an embodiment of the invention.

FIG. 8 depicts a graph 800 of the first 12 billion switching cycles resulting from a memristor 100 formed of a first electrode 102 comprising tantalum, a second electrode 104 comprising platinum, and a switching layer formed to tantalum oxide. As shown therein, during at least the first 12 billion switching cycles, there are definite and repeatable distinctions between the resistance levels for the on (upper data points) and off (lower data points) states. These results indicate that the memristor 100 disclosed herein has a relatively greater level of endurance as compared with previous memristors having different configurations.

What has been described and illustrated herein is an embodiment along with some of its variations. The terms, descriptions and figures used herein are set forth by way of illustration only and are not meant as limitations. Those skilled in the art will recognize that many variations are possible within the spirit and scope of the subject matter, which is intended to be defined by the following claims—and their equivalents—in which all terms are meant in their broadest reasonable sense unless otherwise indicated.

What is claimed is:

1. A memristor comprising:
  a first electrode formed of a first metal;
  a second electrode formed of a second material, wherein the second material comprises a different material from the first metal;
  a switching layer positioned between the first electrode and the second electrode, said switching layer formed of a composition of a first material comprising the first metal and a second nonmetal material, wherein the switching layer is in direct contact with the first metal of the first electrode and wherein at least one conduction channel is configured to be formed in the switching layer from an interaction between the first metal and the second nonmetal material;

at least one intermediate layer positioned between the first electrode and the second electrode, wherein the at least one intermediate layer is formed of a metal material; and at least one second switching layer positioned between the at least one intermediate layer and the second electrode.

2. The memristor according to claim 1, wherein the first metal comprises tantalum and the nonmetal material comprises oxygen.

3. The memristor according to claim 1, wherein the first metal comprises a metal selected from the group consisting of tantalum (Ta), hafnium (Hf), yttrium (Y), cobalt (Co), erbium (Er), scandium (Sc), and combinations thereof.

4. The memristor according to claim 1, wherein the second nonmetal material comprises a material selected from the group consisting of oxygen, nitrogen, carbon, sulfur, phosphorus, and chlorine.

5. The memristor according to claim 1, wherein the first metal and the second nonmetal material satisfy:
   (a) that the one or more materials forming the at least one conductance channel is in thermodynamic equilibrium with the one or more materials forming a matrix hosting the at least one conductance channel; and
   (b) that the first metal that forms the first electrode and the at least one conductance channel with oxygen has a predetermined amount of oxygen solubility at room temperature.

6. The memristor according to claim 1, wherein the at least one intermediate layer is formed of the first metal.

7. A crossbar array comprising:
   a plurality of memristors, each of said memristors being formed of:
      a first electrode formed of a first metal;
      a second electrode formed of a second material, wherein the second material comprises a different material from the first metal;
      a switching layer positioned between the first electrode and the second electrode, said switching layer formed of a composition of a first material comprising the first metal and a second nonmetal material, wherein the switching layer is in direct contact with the first metal of the first electrode and wherein at least one conduction channel is configured to be formed in the switching layer from an interaction between the first metal and the second nonmetal material;
      at least one intermediate layer positioned between the first electrode and the second electrode, wherein the at least one intermediate layer is formed of a metal material; and
      at least one second switching layer positioned between the at least one intermediate layer and the second electrode.

8. The crossbar array according to claim 7, wherein the first metal comprises tantalum and the nonmetal material comprises oxygen.

9. A method for fabricating a memristor, said method comprising:
   providing a first electrode formed of a first metal, wherein the first metal comprises a metal selected from the group consisting of tantalum (Ta), hafnium (Hf), yttrium (Y), cobalt (Co), erbium (Er), scandium (Sc), and combinations thereof;
   providing a switching layer formed of a composition of a first material comprising the first metal and a second nonmetal material on and in direct contact with the first electrode;
   providing a second electrode formed of a second material above the switching layer, wherein the second material comprises a different material from the first metal; and
   forming at least one conductance channel in the switching layer through an interaction between the first metal and the second nonmetal material.

10. The method according to claim 9, further comprising:
   selecting the first metal and the second nonmetal material by satisfying,
      (a) that the one or more materials forming the at least one conductance channel is in thermodynamic equilibrium with the one or more materials forming a matrix hosting the at least one conductance channel; and
      (b) that the first metal that forms the first electrode and the at least one conductance channel with oxygen has a predetermined amount of oxygen solubility at room temperature.

11. The method according to claim 10, further comprising:
   implementing a phase diagram depicting interactions between the first metal and the second nonmetal material at different compositions in selecting the composition of the first metal and the second nonmetal material.

12. The method according to claim 9, wherein the first metal comprises tantalum and the nonmetal material comprises oxygen.

13. The method according to claim 9, further comprising:
   providing at least one intermediate layer positioned between the first electrode and the second electrode, wherein the at least one intermediate layer is formed of a metal material; and
   providing at least one second switching layer between the at least one intermediate layer and the second electrode.

* * * * *